(12) United States Patent
Taketomo et al.

(10) Patent No.: US 7,880,967 B2
(45) Date of Patent: Feb. 1, 2011

(54) OPTICAL ELEMENT, OPTICAL DEVICE, AND METHOD OF PRODUCING OPTICAL ELEMENT

(75) Inventors: Mikihiro Taketomo, Tokyo (JP); Toshitaka Kawashima, Kanagawa (JP); Yoshihiro Oshima, Kanagawa (JP)

(73) Assignee: Sony Corporation, Tokyo (JP)

( * ) Notice: Subject to any disclaimer, the term of this patent is extended or adjusted under 35 U.S.C. 154(b) by 481 days.

(21) Appl. No.: 11/948,764

(22) Filed: Nov. 30, 2007

(65) Prior Publication Data

US 2008/0158680 A1 Jul. 3, 2008

(30) Foreign Application Priority Data

Dec. 27, 2006 (JP) ............................... 2006-350891

(51) Int. Cl.
*G02B 5/00* (2006.01)
*B32B 9/00* (2006.01)

(52) U.S. Cl. ..................... 359/586; 428/689; 428/699; 428/702; 428/913

(58) Field of Classification Search .................. None
See application file for complete search history.

(56) References Cited

U.S. PATENT DOCUMENTS

| 6,511,584 B1 | 1/2003 | Szczyrbowski et al. |
| 6,589,657 B2 | 7/2003 | Dannenberg |
| 2003/0170466 A1 * | 9/2003 | Stachowiak ............... 428/432 |

FOREIGN PATENT DOCUMENTS

| JP | 10-030177 | 2/1998 |
| JP | 10-048402 | 2/1998 |
| JP | 2001-116921 | 4/2001 |
| JP | 2003-094548 | 4/2003 |
| JP | 2003-114302 | 4/2003 |
| JP | 2005-502077 | 1/2005 |
| JP | 2006-284453 | 10/2006 |

\* cited by examiner

*Primary Examiner*—Ling Xu
(74) *Attorney, Agent, or Firm*—K&L Gates LLP

(57) ABSTRACT

An optical element includes an optical film; a substrate; and an adhesive layer disposed between the optical film and the substrate, wherein the adhesive layer is made of $NbO_x$, where $0<x<2.5$.

6 Claims, 8 Drawing Sheets

FIG. 5

|  |  | (1) | (2) | (3) | (4) | (5) | (6) | (7) | (8) | (9) |
|---|---|---|---|---|---|---|---|---|---|---|
| SnO2 SUBLAYER | ELECTRIC POWER DENSITY (W/cm²) | 3.9 | 3.9 | 3.9 | 3.9 | 3.9 | 3.9 | 3.9 | 3.9 | 3.9 |
|  | TARGET VOLTAGE (V) | 450 | 450 | 450 | 450 | 450 | 450 | 450 | 450 | 450 |
|  | REACTIVE GAS ($CO_2$) FLOW RATIO (%) | 80 | 80 | 80 | 80 | 80 | 80 | 80 | 80 | 80 |
|  | THICKNESS (nm) | 150 | 150 | 150 | 150 | 150 | 150 | 150 | 150 | 150 |
|  | ELECTRIC POWER DENSITY (W/cm²) | 3.9 | 3.9 | 3.9 | 3.9 | 3.9 | 3.9 | 3.9 | 3.9 | 3.9 |
|  | TARGET VOLTAGE (V) | 370 | 370 | 370 | 370 | 370 | 370 | 370 | 370 | 370 |
|  | REACTIVE GAS ($O_2$) FLOW RATIO (%) | 40 | 40 | 40 | 40 | 40 | 40 | 40 | 40 | 40 |
|  | THICKNESS (nm) | 160 | 160 | 160 | 160 | 160 | 160 | 160 | 160 | 160 |
| ADHESIVE LAYER | TARGET | Si | Si | Si | Sn | Sn | Sn | Nb | Nb | Nb |
|  | ELECTRIC POWER DENSITY (W/cm²) | 0.39 | 0.39 | 0.39 | 0.2 | 0.39 | 0.39 | 0.39 | 0.39 | 0.39 |
|  | TARGET VOLTAGE (V) | 310 | 315 | 240 | 380 | 345 | 310 | 325 | 450 | 330 |
|  | REACTIVE GAS | — | $CO_2$ | $O_2$ | — | $CO_2$ | $O_2$ | — | $CO_2$ | $O_2$ |
|  | FLOW RATIO (%) | 0 | 15 | 15 | 0 | 50 | 25 | 0 | 10 | 10 |
|  | THICKNESS (nm) | 2 | 2 | 2 | 2 | 2 | 2 | 2 | 2 | 2 |

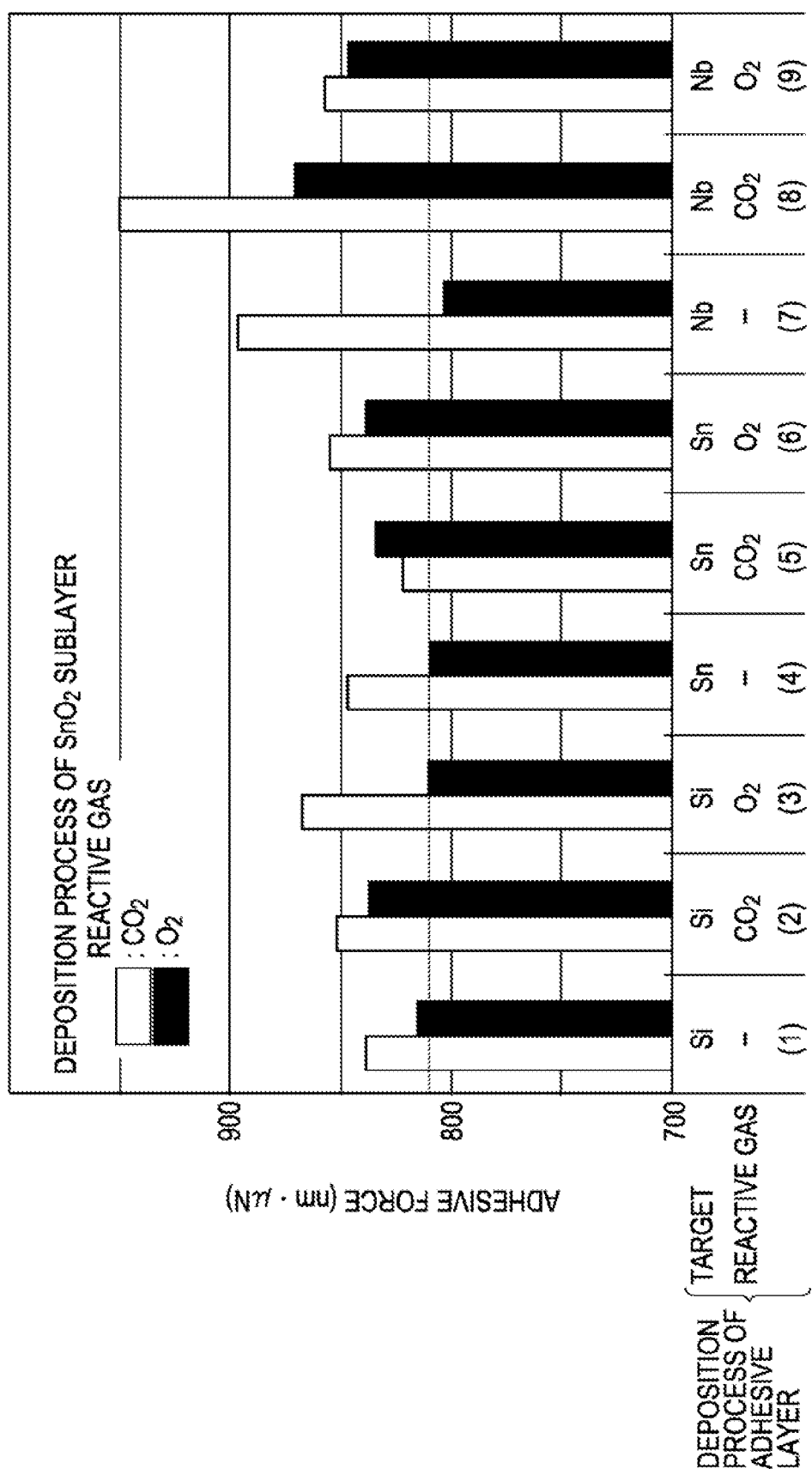

FIG. 7A

| | ADHESIVE LAYER | | |
| --- | --- | --- | --- |
| | NbOx | SiOx | NOT FORMED |
| THICKNESS OF SnO2 SUBLAYER — 50 nm | A | A | A |
| 70 nm | A | A | A |
| 100 nm | A | A | A |
| 120 nm | A | A | A |
| 150 nm | C/A | C/A | C/A |

FIG. 7B

| | ADHESIVE LAYER | | |
| --- | --- | --- | --- |
| | NbOx | SiOx | NOT FORMED |
| THICKNESS OF SnO2 SUBLAYER — 50 nm | A | A | B |
| 70 nm | B | B | B |
| 100 nm | B | C | C |
| 120 nm | B | B | C |
| 150 nm | C | C | C |

PRIOR ART

OPTICAL ELEMENT, OPTICAL DEVICE, AND METHOD OF PRODUCING OPTICAL ELEMENT

CROSS REFERENCES TO RELATED APPLICATIONS

The present application claims priority to Japanese Patent Application JP 2006-350891 filed in the Japanese Patent Office on Dec. 27, 2006,the entire contents of which are incorporated herein by reference.

BACKGROUND

The present application relates to an optical element, an optical device, and a method of producing an optical element.

Recently, demands for optical elements such as liquid crystal display elements, and optical devices have markedly increased. In such optical elements and optical devices, for example, in order to increase the transmittance of light, to prevent reflection of light, and to protect the surface of a display element, an optical film including a silicon oxide sublayer, a tin oxide sublayer, and the like is provided on a substrate made of a plastic or the like, and this substrate made of a plastic or the like with the optical film provided thereon is bonded onto the display element.

Such an optical film is provided on a substrate of an optical element or an optical device as a plurality of sublayers having different refractive indices in order to mainly prevent the reflection of external light. However, the adhesiveness, the durability, and the like of the bond between the substrate, in particular, a plastic substrate, and the optical film that are used in the optical element or the optical device are not satisfactory. Consequently, in an optical element such as a liquid crystal display element or an optical device, in order to improve the adhesiveness between the optical film, which is made of inorganic substances, and the plastic substrate, which is made of an organic substance, for example, a thin film made of titanium or chromium, or a thin layer made of an oxide such as silicon monoxide (SiO) or silicon dioxide ($SiO_2$) is provided. Such a thin film provided between the optical film and the plastic substrate is referred to as a close-contact layer, an adhesive layer, an interlayer, or the like.

Japanese Unexamined Patent Application Publication No. 2003-94548 ('548 document) entitled "anti-reflection film" (FIG. 1, paragraphs 0014 and 0015 and paragraphs 0017 to 0019) discloses an anti-reflection film described below.

FIG. 8A, which is FIG. 1 in '548 document, is a view showing an example of the structure of an anti-reflection film including an adhesive layer.

FIG. 8A shows a lamination structure of an anti-reflection film according to an embodiment of '548 document. The anti-reflection film includes a substrate 41, an adhesive layer 43 for improving the adhesiveness provided on the substrate 41, an anti-reflection layer 40 provided on the adhesive layer 43, and an antifouling sublayer 33 provided on the anti-reflection layer 40. The anti-reflection layer 40 includes an alloy oxide sublayer 45 functioning as a medium-refractive-index sublayer, a high-refractive-index sublayer 47, and a low-refractive-index sublayer 49.

In the above structure, the substrate 41 is made of a film having high transparency in the visible light range, such as a film of an alicyclic polyolefin, e.g., polyethylene terephthalate (PET) or polycarbonate (PC), or triacetyl cellulose (TAC). However, the material of the substrate 41 is not limited to an organic substance, and the substrate 41 may be made of an inorganic substance.

The adhesive layer 43 is made of at least one material selected from Si, $SiO_x$ (wherein x=1 to 2), SiN, $SiO_xN_y$ (wherein x=1 to 2 and y=0.2 to 0.6), $CrO_x$ (wherein x=0.2 to 1.5), and $ZrO_x$ (wherein x=1 to 2) and deposited by, for example, an AC sputtering method. The adhesive layer 43 has a thickness in the range of about 3 to 5 nm, which is sufficiently smaller than the wavelength of light. Therefore, this layer does not affect optical characteristics of the anti-reflection film.

The anti-reflection layer 40 provided on the substrate 41, with the adhesive layer 43 therebetween, is formed by sequentially depositing each sublayer by a reactive sputtering method. The alloy oxide sublayer 45 is deposited first as a medium-refractive-index sublayer. The alloy oxide sublayer 45 is made of an alloy oxide material containing Si: Sn, Zr, Ti, Ta, Sb, In, or Nb; and oxygen, which forms an oxide thereof. The refractive index of this alloy oxide sublayer 45 can be controlled by changing the component ratio in the alloy and is optimized in accordance with the refractive index of the substrate 41.

The high-refractive-index sublayer 47 provided on the alloy oxide sublayer 45 is made of a material such as $TiO_2$, $Nb_2O_5$, SiN, $Ta_2O_5$, ITO, IZO, GZO, or AZO. The low-refractive-index sublayer 49 provided on the high-refractive-index sublayer 47 is made of a material such as $SiO_2$ or $MgF_2$.

The antifouling sublayer 33 provided on the low-refractive-index sublayer 49 is made of, for example, an alkoxysilane compound having a perfluoropolyether group and formed by a wet process.

According to the above structure, the refractive index of the medium-refractive-index sublayer can be easily optimized in accordance with the refractive index of the substrate 41. A three-layered anti-reflection (AR) film having excellent anti-reflection performance can be easily produced, and an anti-reflection film having excellent durability and antifouling property can be obtained.

PCT Japanese Translation Patent Publication No. 2005-502077 ('077 document) entitled "anti-reflection film and method related thereto" (FIG. 1, paragraphs 0010 to 0016) discloses an anti-reflection film described below.

FIG. 8B, which is FIG. 1 in '077 document, is a view showing an example of the structure of an anti-reflection film that does not include an adhesive layer.

The anti-reflection film shown in FIG. 8B is deposited on a substrate 53 used as a base described in an embodiment of '077 document. This substrate 53 is made of glass or a plastic. An optical thin film 51 includes a first sublayer 55, a second sublayer 57, and a third sublayer 59. The first sublayer 55 is deposited on the substrate 53, the second sublayer 57 is deposited on the first sublayer 55, and the third sublayer 59 is deposited on the second sublayer 57. These depositions are performed by sputtering, evaporation by heating, or another method of the related art. The first sublayer 55 has a medium refractive index, for example, in the range of about 1.7 to 2.1.The second sublayer 57 has a high refractive index, for example, in the range of about 2.2 to 2.6.The third sublayer 59 has a low refractive index, for example, in the range of about 1.46 to 1.52.

The first sublayer 55 is made of a dielectric material such as silicon nitride, zinc oxide, indium tin oxide (ITO), bismuth oxide, stannic oxide, zirconium oxide, hafnium oxide, antimony oxide, or gadolinium oxide. The second sublayer 57 is made of titanium oxide, niobium oxide, or tantalum oxide. Titanium oxide has a refractive index of about 2.4 or more, niobium oxide has a refractive index of about 2.28,and tantalum oxide has a refractive index of about 2.2.The third sublayer 59 is made of silicon oxide or magnesium fluoride.

Apparatuses for forming thin films are disclosed in, for example, Japanese Unexamined Patent Application Publication No. 2003-114302 (FIG. 2, paragraphs 0022 to 0024), Japanese Unexamined Patent Application Publication No. 2001-116921 (FIG. 2,paragraphs 0015 to 0023), and Japanese Unexamined Patent Application Publication No. 10-48402 (FIGS. 3 to 6,paragraphs 0031 to 0048).

A metallic mode and an oxide mode in reactive sputtering are disclosed in, for example, Japanese Unexamined Patent Application Publication No. 10-30177 (FIG. 1,paragraphs 0009 to 0013). Japanese Unexamined Patent Application Publication No. 2006-284453 ('453 document) entitled "method of evaluating thin-film adhesiveness" discloses the following method (FIGS. 1 and 2,paragraphs 0009 to 0013).

As described therein, the '453 document relates to a method of evaluating the thin-film adhesiveness for quantitatively evaluating the adhesiveness between a thin film deposited on a plastic substrate and the substrate. In the method, a diamond indenter is pressed into a thin film, while a certain amount of load is applied to the indenter. Thus, an indentation depth-load curve characteristic is measured. A displacement point at which the deformation of the film is changed from elastic deformation to plastic deformation in the resulting indentation depth-load curve characteristic is defined as a separation point. A value obtained by multiplying the indentation depth from the starting point to the above separation point by the load applied from the starting point to the above separation point is defined as a workload, and the integrated value from the starting point to the separation point is used as an indicator of the adhesion strength between the thin film and the substrate.

In the method of evaluating the thin-film adhesiveness disclosed in '453 document, more specifically, the indentation depth-load curve characteristic is measured by pressing a triangular pyramid-shaped diamond indenter having a small radius of curvature and a sharp end into a thin film using a TriboIndenter.

Furthermore, in the method of evaluating the thin-film adhesiveness disclosed in '453 document, the adhesiveness between a plastic substrate and a thin film made of an inorganic material and deposited on the substrate is quantitatively evaluated. In the '453 document, by using a vertical indentation, the adhesive force between an ultra thin film having a nanometer-order thickness, for example, a thickness of about several tens of nanometers, and a substrate can be quantitatively measured with a high repeatability. Accordingly, the adhesive force of a thin film having a nanometer-order thickness can be quantitatively evaluated with a high repeatability.

In the related art, an adhesive layer is provided between a substrate (support) such as a plastic film and an anti-reflection layer. However, when the anti-reflection layer is formed on a substrate such as a flexible plastic film, the anti-reflection layer is easily separated from the substrate. For example, in an anti-reflection film produced by forming a $SiO_x$ (wherein $1<x<2$) film serving as an adhesive layer on a PET film used as a substrate, and forming a $SnO_2$ thin film serving as the bottom sublayer of the anti-reflection layer on the adhesive layer, cracks are formed after various types of tests.

SUMMARY

The present application has been made in order to solve the above problems. It is desirable to provide an optical element and an optical device in which an optical film is adhered on a substrate with an adhesive layer therebetween, and which has excellent adhesive force and durability, and a method of producing the optical element.

According to an embodiment, in a structure in which an optical film is stacked on a substrate of an optical element such as a liquid crystal display element, or an optical device, by forming a layer made of a specific material as a layer (adhesive layer) that is in contact with the substrate, an optical element and an optical device having excellent adhesiveness and durability can be produced.

An optical element according to an embodiment includes an optical film; a substrate; and an adhesive layer disposed between the optical film and the substrate, wherein the adhesive layer is made of $NbO_x$ (wherein $0<x<2.5$). An optical device according to an embodiment includes the above optical element.

According to an embodiment, in a method of producing an optical element including an optical film, a substrate, and an adhesive layer disposed between the optical film and the substrate, the method includes the steps of forming, as the adhesive layer, a $NbO_x$ layer on the substrate in an oxidizing atmosphere so as to satisfy a relationship $0<x<2.5$; and forming the optical film on the adhesive layer.

Herein, the terms "optical element" and "optical device" mean an element and a device capable of transmitting or absorbing a light beam or capable of emitting or receiving a light beam, and thus which can transmit, output, or input information using the light beam. Examples thereof include various types of elements and devices such as a liquid crystal display element, an optical lens, and an optical prism.

In an optical element and an optical device according to an embodiment, since the adhesive layer is made of a $NbO_x$ layer (wherein $0<x<2.5$), the adhesiveness between the optical film and the substrate can be increased by the adhesive layer. Accordingly, an optical element and an optical device having excellent adhesive force and durability can be provided.

In a method of producing an optical element according to an embodiment, the method includes the steps of forming, as the adhesive layer, a $NbO_x$ layer on the substrate in an oxidizing atmosphere so as to satisfy a relationship $0<x<2.5$; and forming the optical film on the adhesive layer. Accordingly, the adhesiveness between the optical film and the substrate can be increased by the adhesive layer. Consequently, an optical element having excellent adhesive force and durability can be produced with a satisfactory reproducibility.

Additional features and advantages are described herein, and will be apparent from, the following Detailed Description and the figures.

BRIEF DESCRIPTION OF THE FIGURES

FIG. 5 is a table showing the conditions for forming a $SnO_2$ sublayer included in an anti-reflection layer, and an adhesive layer, according to an embodiment;

FIG. 6 is a graph showing the structure of the adhesive layer, deposition processes, and evaluation results of the adhesive force, according to the embodiment;

FIGS. 7A and 7B are tables showing the results of a storing lest of anti-reflection films.

DETAILED DESCRIPTION

Figure 1:
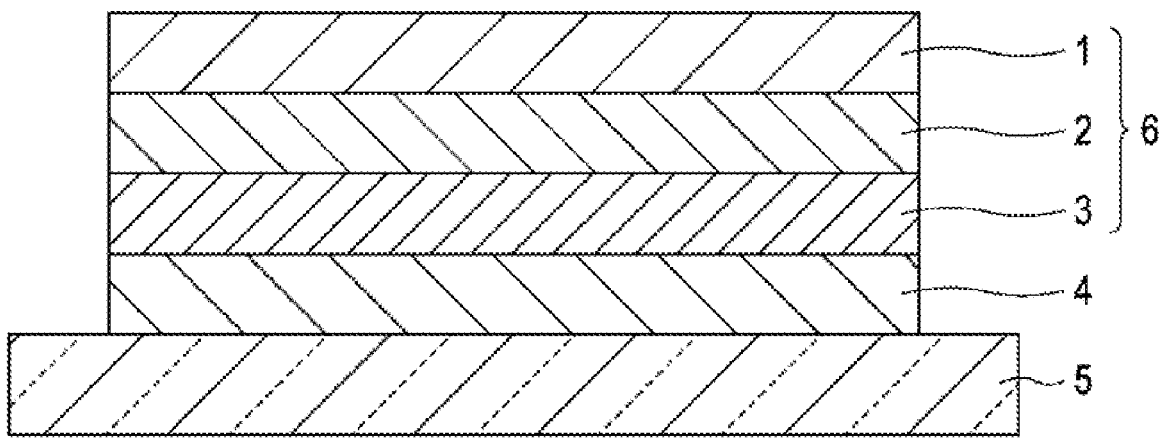
FIG. 1 is a cross-sectional view illustrating an example of the structure of an anti-reflection film according to an embodiment.

In an optical element according to an embodiment, surfaces of the adhesive layer are preferably in contact with the optical film and the substrate, and the substrate and the optical film are preferably integrated with each other, with the adhesive layer therebetween. A surface of the adhesive layer is in close contact with the optical film, and another surface of the adhesive layer is in close contact with the substrate, and the substrate and the optical film are in close contact and integrated with each other with the adhesive layer therebetween. Therefore, an optical element having excellent adhesive force and durability can be realized.

Preferably, the optical film is an anti-reflection layer in which a plurality of sublayers having different refractive indices are stacked, the surfaces of the adhesive layer are in contact with the bottom sublayer of the anti-reflection layer and the substrate, and the substrate and the bottom sublayer are integrated with each other, with the adhesive layer therebetween. Since the optical film in which a plurality of sublayers having different refractive indices are stacked is used as the anti-reflection layer, a surface of the adhesive layer is in close contact with the bottom sublayer of the anti-reflection layer, another surface of the adhesive layer is in close contact with the substrate, and the substrate and the anti-reflection layer are in close contact and integrated with each other with the adhesive layer therebetween, an optical element having excellent adhesive force and durability can be realized.

The bottom sublayer is preferably composed of a $SnO_2$ sublayer. Since the bottom sublayer is composed of a $SnO_2$ sublayer, excellent adhesive force between the bottom sublayer and the adhesive layer can be realized.

Furthermore, a high-refractive-index sublayer having a refractive index higher than that of the bottom sublayer is preferably provided on the bottom sublayer, and a low-refractive-index sublayer having a refractive index lower than that of the bottom sublayer is preferably provided on the high-refractive-index sublayer. According to this structure, an anti-reflection film including an anti-reflection layer with excellent performance can be realized.

The low-refractive-index sublayer is preferably selected from a $SiO_2$ sublayer, a $MgF_2$ sublayer, an $AlF_3$ sublayer, and a $CaF_2$ sublayer. The high-refractive-index sublayer is preferably selected from a $Nb_2O_5$ sublayer, a $TiO_2$ sublayer, a $ZrO_2$ sublayer, a $ZnO$ sublayer, a $Ta_2O_5$ sublayer, a $CeO_2$ sublayer, an $Y_2O_3$ sublayer, a $La_2O_3$ sublayer, a $HfO_2$ sublayer, a $MoO_2$ sublayer, and a $WO_3$ sublayer. According to this structure, an anti-reflection film including an anti-reflection layer that can be suitably used for various applications can be realized.

In a method of producing an optical element according to an embodiment, the adhesive layer is preferably formed by reactive sputtering using Nb as a target while $CO_2$ is supplied as a reactive gas. Since the adhesive layer is formed by reactive sputtering using Nb as a target while $CO_2$ is supplied as a reactive gas, an adhesive layer having excellent adhesive force and durability can be formed.

The adhesive layer is preferably formed in a range of a metallic mode in which the target has a metal surface. Since the adhesive layer is formed in the range of the metallic mode in which the target has a metal surface, $NbO_x$ having a desired composition satisfying $0<x<2.5$ can be formed in a state in which the formation of $Nb_2O_5$ is suppressed, and thus an adhesive layer which has a high adhesive force and in which the generation of cracks can be prevented can be formed.

When the reactive gas is supplied together with Ar gas and the flow ratio (%) of the volume of the reactive gas to the total volume of the reactive gas and the Ar gas is represented by V, the adhesive layer is preferably formed in a state in which the flow ratio of the reactive gas satisfies $0<V\leq5$. Since the adhesive layer is formed in a state in which the flow ratio of the reactive gas satisfies $0<V\leq5$, by controlling the flow ratio of the reactive gas, $NbO_x$ having a desired composition satisfying $0<x<2.5$ can be formed in a state in which the formation of $Nb_2O_5$ is suppressed.

The adhesive layer is preferably formed in a range of a transition mode which is a range between a range of a metallic mode in which the target has a metal surface and a range of an oxide mode in which the target has an oxide surface, and in which the target surface transits between the metallic mode and the oxide mode. Since the adhesive layer is formed in the range of the transition mode, by controlling the flow ratio of the reactive gas, $NbO_x$ having a desired composition satisfying $0<x<2.5$ can be formed in a state in which the formation of $Nb_2O_5$ is suppressed.

When the reactive gas is supplied together with Ar gas and the flow ratio (%) of the volume of the reactive gas to the total volume of the reactive gas and the Ar gas is represented by V, the adhesive layer is preferably formed in a state in which the flow ratio of the reactive gas satisfies $5<V\leq30$. Since the adhesive layer is formed in a state in which the flow ratio of the reactive gas satisfies $5<V\leq30$, by controlling the flow ratio of the reactive gas, $NbO_x$ having a desired composition satisfying $0<x<2.5$ can be formed in a slate in which the formation of $Nb_2O_5$ is suppressed.

The adhesive layer is preferably formed in a state in which the flow ratio of the reactive gas satisfies $5<V\leq20$. Since the adhesive layer is formed in a state in which the How ratio of the reactive gas satisfies $5<V\leq20$, by controlling the How ratio of the reactive gas, $NbO_x$ having a desired composition satisfying $0<x<2.5$ can be formed without forming $Nb_2O_5$ in a state in which the formation of $Nb_2O_5$ is suppressed.

In the step of forming the optical film, the optical film is preferably formed as an anti-reflection layer produced by slacking a plurality of sublayers having different refractive indices, the surfaces of the adhesive layer are preferably brought into contact with the bottom sublayer of the anti-reflection layer and the substrate, and the substrate and the bottom sublayer are preferably integrated with each other, with the adhesive layer therebetween. Thus, the optical film is formed as an anti-reflection layer produced by stacking a plurality of sublayers having different refractive indices, a surface of the adhesive layer is in close contact with the bottom sublayer of the anti-reflection layer and another surface of the adhesive layer is in close contact with the substrate so as to be integrated with each other, and the substrate and the anti-reflection layer are in close contact and integrated with each other with the adhesive layer therebetween. Therefore, an optical element having excellent adhesive force and durability can be realized.

A $SnO_2$ sublayer is preferably formed as the bottom sublayer. Since a $SnO_2$ sublayer is formed as the bottom sublayer, excellent adhesive force between the bottom sublayer and the adhesive layer can be realized.

The bottom sublayer is preferably formed by reactive sputtering using Sn as a target while $CO_2$ is supplied as a reactive gas. Since the bottom sublayer is formed by reactive sputtering using Sn as a target while $CO_2$ is supplied as a reactive gas, a $SnO_2$ sublayer that is in close contact with the adhesive layer can be formed.

When the reactive gas is supplied together with Ar gas and the flow ratio (%) of the volume of the reactive gas to the total volume of the reactive gas and the Ar gas is represented by V, the bottom sublayer is preferably formed in a slate in which the flow ratio of the reactive gas satisfies $0<V\leq100$. Since the $SnO_2$ sublayer is formed in a state in which the flow ratio of the reactive gas satisfies $0<V\leq100$, the $SnO_2$ sublayer can be formed in a state of any flow ratio of the reactive gas. Preferably, the bottom sublayer is formed in a state in which the flow ratio of the reactive gas satisfies $30\leq V\leq100$. When the flow ratio of the reactive gas is in the range of $30\leq V\leq100$, the deposition rate is decreased but the $SnO_2$ sublayer can be reliably formed without forming $SnO_x$ (wherein $0<x<2$).

The bottom sublayer is preferably formed in a range of a metallic mode in which the target has a metal surface, in a range of an oxide mode in which the target has an oxide surface, or in a range of a transition mode which is a range between the range of the metallic mode and the range of the oxide mode and in which the target surface transits between the metallic mode and the oxide mode. According to this method, the $SnO_2$ sublayer can be formed in a range of any mode. Preferably, the bottom sublayer is formed in the range of the oxide mode. When the bottom sublayer is formed in the range of the oxide mode, the deposition rate is decreased but the $SnO_2$ sublayer can be reliably formed without forming $SnO_x$ (wherein $0<x<2$).

Preferably, the method of producing an optical element according to an embodiment further include the steps of forming, on the bottom sublayer, a high-refractive-index sublayer having a refractive index higher than that of the bottom sublayer, and forming, on the high-refractive-index sublayer, a low-refractive-index sublayer having a refractive index lower than that of the bottom sublayer. According to this method, an anti-reflection film including an anti-reflection layer having an excellent performance can be produced.

The low-refractive-index sublayer is preferably formed using a material selected from $SiO_2$, $MgF_2$, $AlF_2$, and $CaF_2$. The high-refractive-index sublayer is preferably formed using a material selected from $Nb_2O_5$, $TiO_2$, $ZrO_2$, $ZnO$, $Ta_2O_5$, $CeO_2$, $Y_2O_3$, $La_2O_3$, $HfO_2$, $MoO_2$, and $WO_3$. According to this method, an anti-reflection film including an anti-reflection layer that can be suitably used for various applications can be produced.

Embodiments will now be described in detail with reference to the drawings.

An anti-reflection film in an optical element or an optical device according to an embodiment includes a substrate (support), an adhesive layer (interlayer, underlayer) provided on the substrate, and an anti-reflection layer adhered on the adhesive layer. The anti-reflection layer is formed by slacking a medium-refractive-index sublayer, a high-refractive-index sublayer, and a low-refractive-index sublayer in that order. This anti-reflection film can be suitably used for, for example, preventing light reflection and protecting the surface of the optical element or the optical device such as a liquid crystal display device.

FIG. 1 is a cross-sectional view illustrating an example of the structure of an anti-reflection film used for an optical element or an optical device according to an embodiment.

As shown in FIG. 1, an anti-reflection layer (optical film) 6 is composed of three sublayers, namely, a $SiO_2$ sublayer 1 (refractive index (hereinafter represented by n)=1.46) serving as a low-refractive-index sublayer, a $Nb_2O_5$ sublayer 2 (n=2.2) serving as a high-refractive-index sublayer, and a $SnO_2$ sublayer 3 (n=1.9) serving as a medium-refractive-index sublayer. The anti-reflection layer 6 is adhered on a substrate 5 with a $NbO_x$ layer 4 (n=2.3) serving as an adhesive layer with a high adhesive force.

Each of the $SiO_2$ sublayer 1, the $Nb_2O_5$ sublayer 2, and the $SnO_2$ sublayer 3, which are sublayers forming the anti-reflection layer 6, and the adhesive layer 4 shown in FIG. 1 can be formed by reactive sputtering using $O_2$ or $CO_2$ as a reactive gas. By controlling the flow ratio of the reactive gas, the composition x in the $NbO_x$ layer 4 serving as the adhesive layer can be controlled.

Each sublayer of the anti-reflection layer 6 and the $NbO_x$ layer 4 are deposited as follows. The pressure in a sputtering chamber of a sputtering system (not shown) is reduced to a predetermined pressure, and Ar gas and another gas such as $O_2$ or $CO_2$ gas are then introduced into the sputtering chamber. Sputtering is then performed in an Ar atmosphere containing a predetermined volume percent of $O_2$ or $CO_2$ gas while the gas pressure during sputtering is controlled to a predetermined pressure. In the sputtering chamber, an atmosphere of $O_2$ or $CO_2$ gas is formed on the surface of a cathode on which a target is placed, and a voltage is applied to the cathode. Accordingly, a sputtered film corresponding to the target is deposited on the substrate 5 disposed so as to face the target. Thus, the adhesive layer ($NbO_x$ layer) 4, the medium-refractive-index sublayer ($SnO_2$ sublayer) 3, the high-refractive-index sublayer ($Nb_2O_5$ sublayer) 2, and the low-refractive-index sublayer ($SiO_2$ sublayer) 1 are sequentially deposited on the substrate 5.

Regarding the thicknesses of the sublayers of the anti-reflection layer 6 and the $NbO_x$ layer 4, for example, the $SiO_2$ sublayer 1 has a thickness in the range of 80 to 100 nm, the $Nb_2O_5$ sublayer 2 has a thickness in the range of 35 to 55 nm, the $SnO_2$ sublayer 3 has a thickness in the range of 60 to 80 nm, and the $NbO_x$ layer 4 has a thickness in the range of 2 to 10 nm. Each of the thicknesses of the sublayers of the anti-reflection layer 6 and the $NbO_x$ layer 4 is controlled using a transmittance monitor by monitoring whether or not a transmittance characteristic designed in advance is satisfied, or using a crystal film-thickness meter by monitoring the film thickness.

Alternatively, each of the sublayers of the anti-reflection layer 6 and the $NbO_x$ layer 4 can be formed by vacuum deposition, ion plating, chemical vapor deposition (CVD), or the like.

<Conditions for Forming Adhesive Layer by Sputtering>

Figure 2:
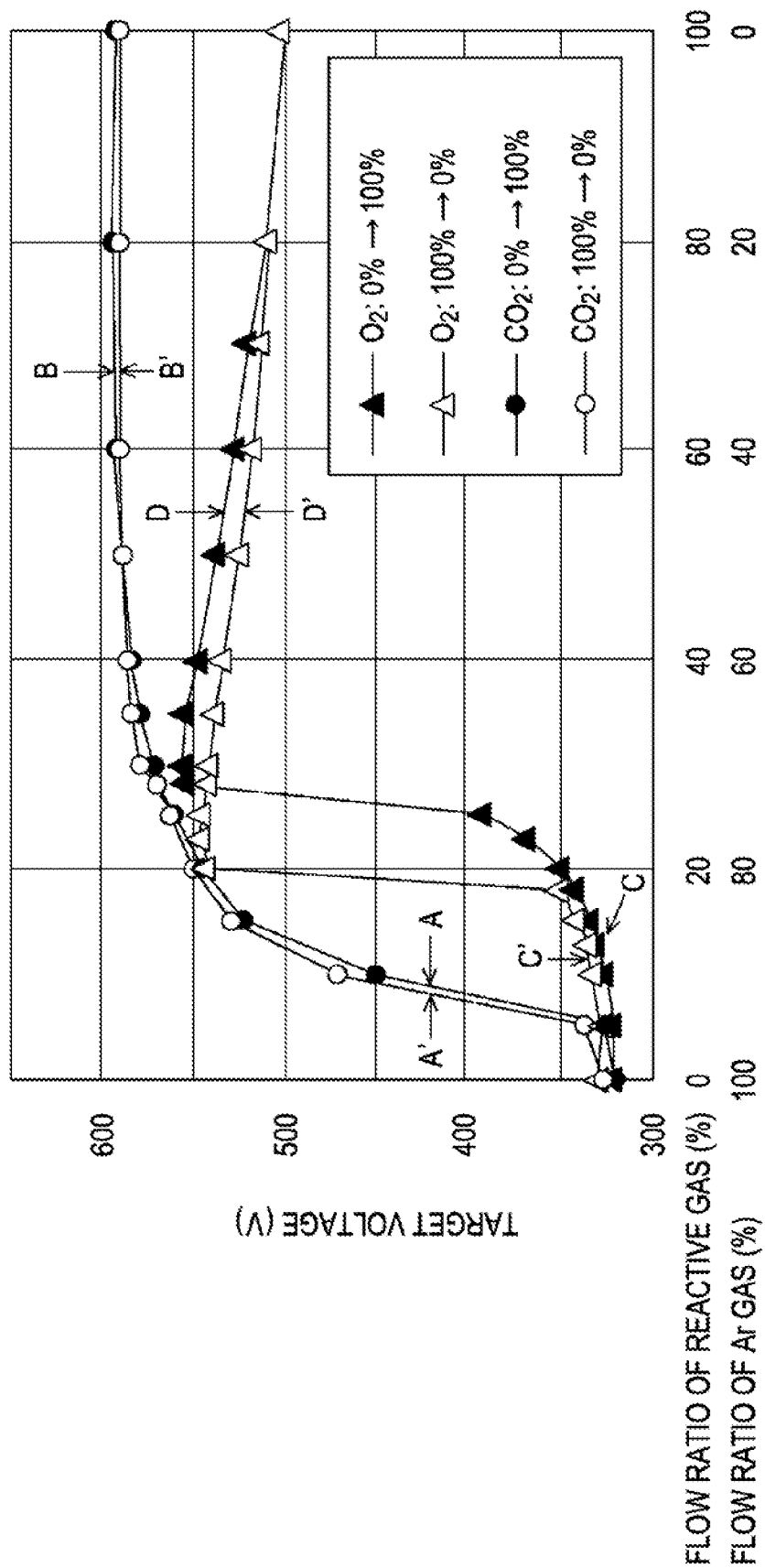
FIG. 2 is a graph showing the relationship between the flow ratio of the volume of a reactive gas to the total volume of the reactive gas and Ar gas and the target voltage in the case where an adhesive layer of an anti-reflection film is formed by reactive sputtering, according to an embodiment.

FIG. 2 is a graph showing the relationship between the flow ratio of the volume of a reactive gas to the total volume of the reactive gas and Ar gas (hereinafter also referred to as "flow ratio of a reactive gas" or the like) and the target voltage in the case where an adhesive layer 4 of an anti-reflection film is formed by reactive sputtering, according to an embodiment.

FIG. 2 includes hysteresis curves obtained by plotting the target voltage (V) and the flow ratio (%) of a reactive gas under a constant electric power in the case where Nb (metal) is used as a target and $O_2$ or $CO_2$ is used as a reactive gas.

The case where $CO_2$ is used as the reactive gas will now be described. When the flow ratio of $CO_2$ is increased from 0% to about 5%, the target voltage is substantially constant in this range. When the flow ratio of $CO_2$ is further increased from about 5% to about 15%, the target voltage is markedly increased in this range. When the flow ratio of $CO_2$ is further increased from about 15% to 30%, the target voltage is gradually increased in this range. When the flow ratio of $CO_2$ is further increased from 30% to 100%, the target voltage is linearly and gradually increased in this range. In this case, a curve AB shown by the arrows A and B in FIG. 2 is obtained. When the flow ratio of $CO_2$ is decreased from 100%, a curve which is similar to the curve AB and in which the target voltage is decreased so as to reversely follow the curve AB, that is, a hysteresis curve B'A' shown by the arrows B' and A' is obtained. When the flow ratio of $CO_2$ is increased or decreased, the flow ratios of $CO_2$ at which the target voltage is markedly increased or decreased are substantially the same, and thus hysteresis is not significant.

The range in which the flow ratio of $CO_2$ is in the range of 0% to about 5% is a range of a metallic mode in which the target has a metal surface, the metal is sputtered and deposited on a substrate, and the deposited metal reacts with oxygen to form an oxide. The range in which the flow ratio of $CO_2$ is in the range of 30% to 100% is a range of an oxide mode in which the target has an oxide surface and the oxide is sputtered and deposited on the substrate. The range in which the flow ratio of $CO_2$ is in the range of 5% to 30% is a range of a transition mode that is present between the metallic mode and the oxide mode.

The case where $O_2$ is used as the reactive gas will now be described. When the flow ratio of $O_2$ is increased from 0% to about 20, the target voltage is gradually increased in this range. When the flow ratio of $O_2$ is further increased from about 20% to about 30%, the target voltage is markedly increased in this range. When the flow ratio of $O_2$ is further increased from about 30% to 100%, the target voltage is linearly and gradually decreased in this range. In this case, a curve CD shown by the arrows C and D in FIG. 2 is obtained. When the flow ratio of $O_2$ is decreased from 100% to about 20%, the target voltage is gradually and linearly increased in this range. When the flow ratio of $O_2$ is further decreased from about 20% to about 15%, the target voltage is markedly decreased in this range. When the flow ratio of $O_2$ is further decreased from about 15% to 0%, the target voltage is gradually decreased in this range. In this case, a hysteresis curve D'C' shown by the arrows D' and C' is obtained. When the flow ratio of $O_2$ is increased or decreased, the flow ratios of $O_2$ at which the target voltage is markedly increased or decreased are significantly different from each other, and thus hysteresis is significant.

When the flow ratio of $O_2$ is increased from 0%, the range in which the flow ratio of $O_2$ is in the range of 0% to about 20% is a range of a metallic mode, the range in which the flow ratio of $O_2$ is in the range of about 30% to 100% is a range of an oxide mode, and the range in which the flow ratio of $O_2$ is in the range of about 20% to about 30% is a range of a transition mode. When the How ratio of $O_2$ is decreased from 100%, the range in which the flow ratio of $O_2$ is in the range of 0% to about 15% is a range of a metallic mode, the range in which the flow ratio of $O_2$ is in the range of about 20% to 100% is a range of an oxide mode, and the range in which the flow ratio of $O_2$ is in the range of about 15% to about 20% is a range of a transition mode.

When $CO_2$ or $O_2$ is used as a reactive gas, in the oxide mode, stable $Nb_2O_5$ is formed as the adhesive layer 4. However, in this case, it is difficult to obtain a satisfactory adhesive force between the adhesive layer 4 and the substrate 5.

When $CO_2$ or $O_2$ is used as a reactive gas, in the metallic mode or the transition mode, amorphous $NbO_x$ (wherein 0<x<2.5) is formed as the adhesive layer 4, the amorphous $NbO_x$ layer has a desired optical transparency, and a satisfactory adhesive force between the adhesive layer 4 and the substrate 5 can be obtained. The reason for this is believed to be as follows. Since the ratio of oxygen atoms in $NbO_x$ (wherein 0<x<2.5) is smaller than that of the stable composition ($Nb_2O_5$), $NbO_x$ having fewer oxygen atoms is activated and its reactivity becomes high, and the adhesiveness to a substrate made of a plastic or the like is markedly improved. When x is zero, $NbO_x$ represents Nb and the resulting adhesive layer has optical characteristics that are different from those of $NbO_x$. However, in the case where $H_2O$ or $O_2$ is present as a residual gas in a sputtering chamber of a sputtering system, even when the flow ratio of $CO_2$ or $O_2$ supplied to the sputtering chamber is zero, Nb, in which x in $NbO_x$ is zero, is not formed, but $NbO_x$ having a small value of x is formed.

As described above, $NbO_x$ (wherein 0<x<2.5) functioning as the adhesive layer 4 can be formed by reactive sputtering using Nb (metal) as a target in the range of the metallic mode or the transition mode while Ar gas is supplied as a neutral gas and $CO_2$ or $O_2$ is supplied as a reactive gas. As a result, excellent adhesiveness between the adhesive layer 4 and the substrate 5 can be realized.

Similar to the above-described deposition of the $NbO_x$ layer functioning as the adhesive layer 4, the $SnO_2$ sublayer 3, the $Nb_2O_5$ sublayer 2, and the $SiO_2$ sublayer 1 shown in FIG. 1 can also be deposited by reactive sputtering in the range of the metallic mode or the transition mode while Ar gas is supplied as a neutral gas and $CO_2$ or $O_2$ is supplied as a reactive gas. Although the $SnO_2$ sublayer 3, the $Nb_2O_5$ sublayer 2, and the $SiO_2$ sublayer 1 can be formed in the range of the oxide mode, the deposition rates are decreased.

<Evaluation of Adhesive Force of Thin Film>

Figure 3A:
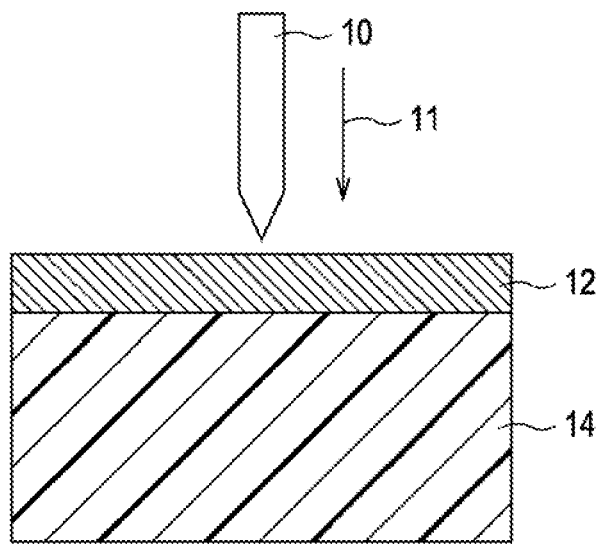
FIGS. 3A to 3C are cross-sectional views illustrating the indentation state of an indenter being pressed into a thin film in an evaluation of the adhesive force of the thin film, according to an embodiment.
Figure 3B:
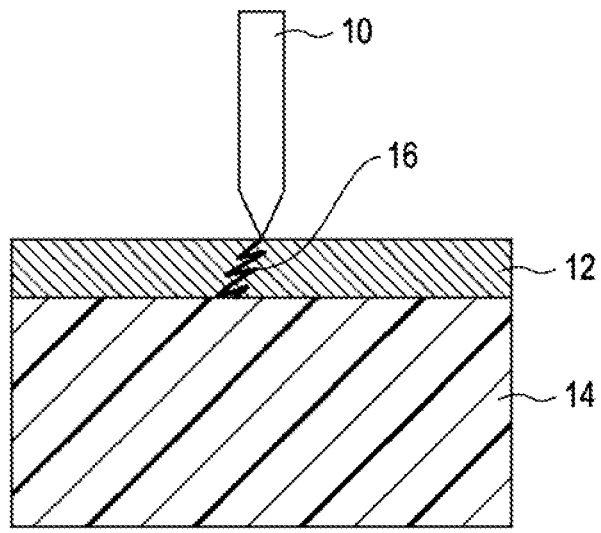
Figure 3C:
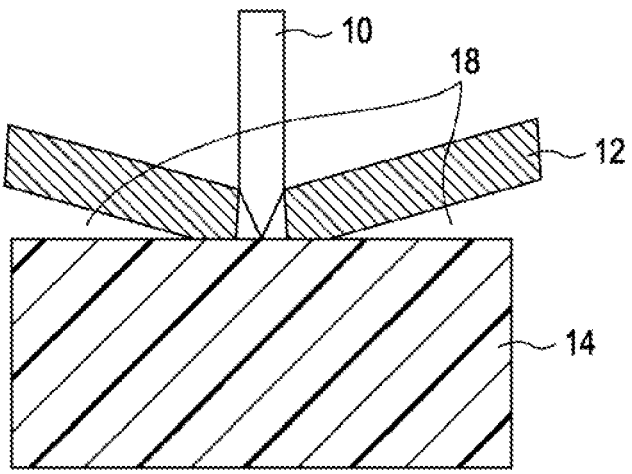

FIGS. 3A to 3C are cross-sectional views illustrating the indentation (pressing) state of an indenter being pressed into a thin film in an evaluation of the adhesive force of the thin film, according to an embodiment. In the figures, an ITO film (tin-doped indium oxide thin film) 12 formed on a film 14 is shown as an example.

As shown in FIG. 3A, the adhesive force between the ITO film 12 and the film 14 can be evaluated by the following method. A diamond indenter 10 is vertically indented (pressed) into the ITO film 12 formed on the film 14 at a predetermined constant speed while an applied indentation load (pressing load) is increased to a predetermined maximum load at a certain constant rate. When the diamond indenter 10 is indented into the ITO film 12, in the case where the adhesive force between the ITO film 12 and the film 14 is not satisfactory, as shown in FIG. 3B, film cracking 16 due to a workload (F) 11 occurs in the ITO film 12 at a certain indentation load. When the indentation depth is further increased, as shown in FIG. 3C, film separation 18 occurs. The workload (F) 11 is defined as the product of the indentation depth and the indentation load.

By measuring the indentation depth (pressing depth) of the diamond indenter 10 with the increase in the indentation load, a load-displacement curve showing the relationship between the indentation depth and the indentation load, which is used for an evaluation of the adhesive force of a thin film, can be obtained.

Figure 4:
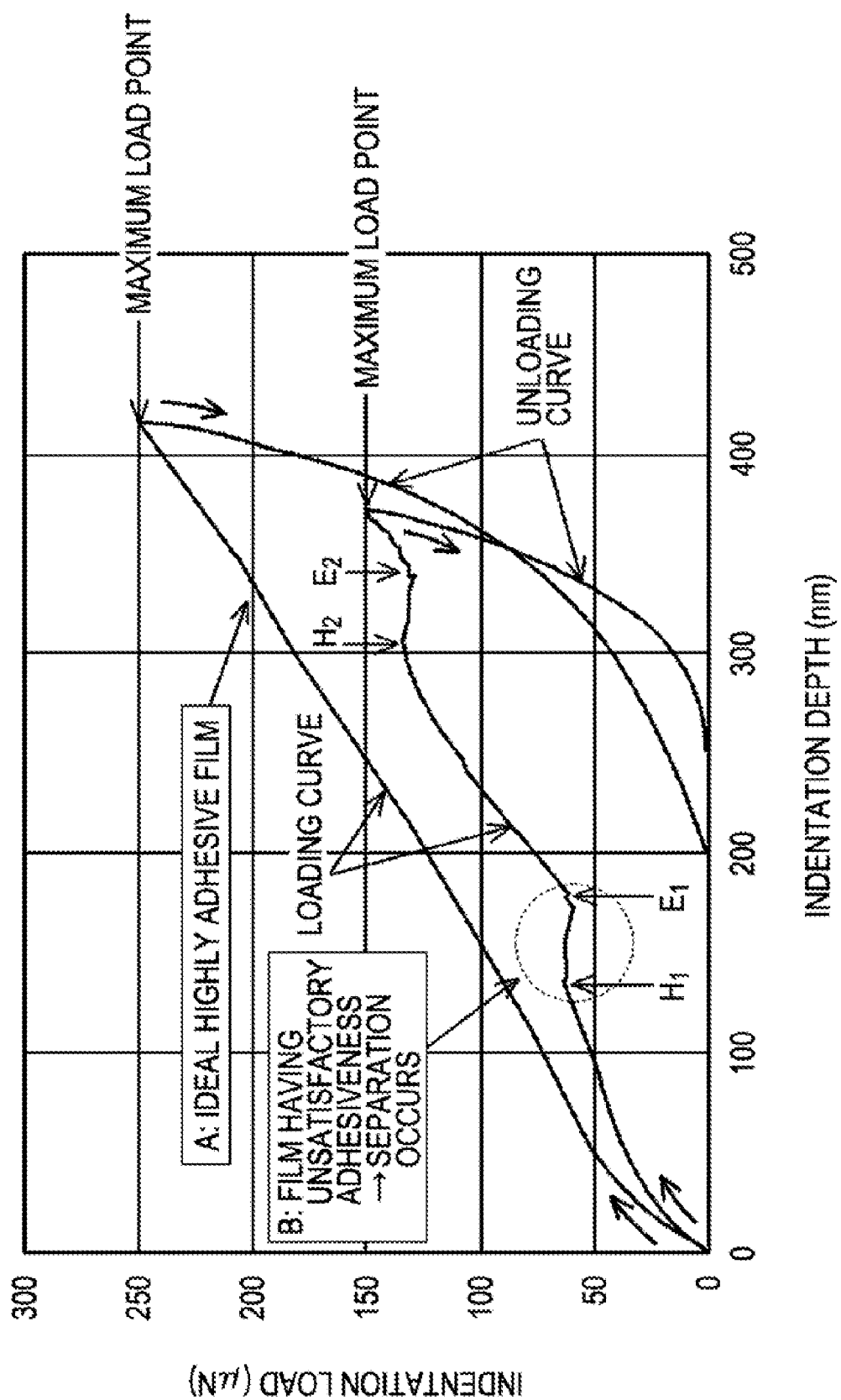
FIG. 4 is a graph showing a load-displacement curve for the evaluation of the adhesive force of a thin film, according to an embodiment.
Figure 8A:
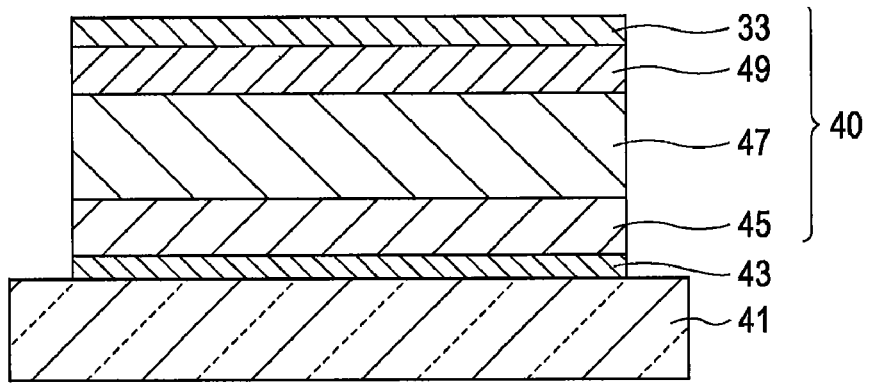
FIGS. 8A and 8B are cross-sectional views showing examples of the structures of anti-reflection films in the related art
Figure 8B:
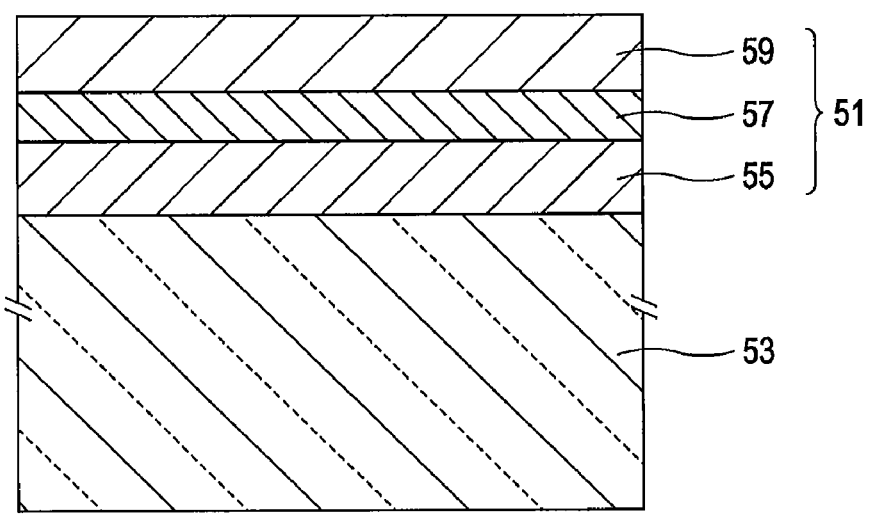

FIG. 4 is a graph of a load-displacement curve showing the relationship between the indentation depth and the indentation load, which is used for the evaluation of the adhesive force of a thin film, according to an embodiment. As described below, this load-displacement curve is shown by a loading curve and an unloading curve.

FIG. 4 shows loading curves and unloading curves that are obtained when an indenter is vertically indented at a predetermined constant speed while an applied indentation load is increased to a predetermined maximum load at a certain constant rate, and the indentation depth is measured. The loading curve shows a range from a point at which the indentation load is zero to a maximum load point at which the maximum load is applied. The unloading curve is obtained while the indentation load is decreased from the maximum load that is applied at the maximum load point to zero. In FIG. 4, the curve denoted by A is measured using an ideal highly adhesive film in which each of stacked sublayers of a thin film are ideally adhered, and the curve denoted by B is measured using a film having unsatisfactory adhesiveness in which each of stacked sublayers of a thin film are not ideally adhered.

As shown in FIG. 4, in the loading curve B measured using the film having unsatisfactory adhesiveness, substantially linear ranges ($H_1$-$E_1$ and $H_2$-$E_2$) in which the indentation depth increases with a substantially constant indentation load are observed. In contrast, such substantially linear ranges are not observed in the loading curve A measured using the ideal highly adhesive film. In each of the substantially linear ranges, since film cracking occurs at the starting point of this range, the indenter is indented while the indentation load applied at that time is maintained. Accordingly, the substantially linear ranges are film separation ranges in which separation of a sublayer proceeds. The sublayer is not separated until the indentation depth reaches point $H_1$ of the loading curve, and thus the range from the point at which the indentation depth is zero to point $H_1$ is an adhesion range. Point $H_1$ is an adhesion point. The range from a point immediately after point $H_1$ to point $E_1$ is a film separation range in which separation of a sublayer proceeds. In the range from a point immediately after point $E_1$ to point $H_2$, separation of a sublayer does not occur and this range is an adhesion range. Point $H_2$ is an adhesion point. The range from a point immediately after point $H_2$ to point $E_2$ is a film separation range in which separation of a sublayer proceeds. The range from a point immediately after point $E_2$ to the maximum load point is an adhesion range in which separation of a sublayer does not occur.

Here, the adhesive force of a thin film is defined as the sum of the products of the indentation load and the indentation depth in all the above-described adhesion ranges. More specifically, the adhesive force of a thin film is defined using the workload (F) 11 described in FIGS. 3A to 3C. According to this definition, the adhesive force of a thin film can be comprehensively evaluated with consideration of both the adhesive strength of the thin film and the stickiness (resistance) against the indentation of an indenter.

<Structure of Adhesive Layer, Deposition Processes, and Evaluation of Adhesive Force>

FIG. 5 is a table showing the conditions (sputtering conditions) for forming a $SnO_2$ sublayer 3 included in an anti-reflection layer 6, and an adhesive layer 4 of an anti-reflection film, according to an embodiment.

Regarding the process conditions for the deposition of the $SnO_2$ sublayer 3, Sn (metal) was used as a target, and a mixed gas (Ar+$CO_2$) (condition A) or a mixed gas (Ar+$O_2$) (condition B) was used as an atmosphere gas. The target voltages, the flow ratios (%), the layer thicknesses, and the electric power densities (W/cm$^2$) during sputtering used for the deposition are shown in columns (1) to (9) in FIG. 5.

Regarding the process conditions for the deposition of the adhesive layer 4, Si (metal), Sn (metal), or Nb (metal) was used as a target, and a mixed gas (Ar+$CO_2$) (condition A: columns (2), (5), and (8) in FIG. 5), a mixed gas (Ar+$O_2$) (condition B: columns (3), (6), and (9) in FIG. 5), or Ar gas (condition C: columns (1), (4), and (7) in FIG. 5) was used as an atmosphere gas. The target voltages, the flow ratios (%), the layer thicknesses, and the electric power densities (W/cm$^2$) during sputtering used for the deposition are shown in FIG. 5.

The adhesive layer 4 was formed on a substrate (a PET film having a thickness of 125 μm) 5, and the $SnO_2$ sublayer 3 was formed on the adhesive layer 4 under the above conditions. The anti-reflection film also includes a $Nb_2O_5$ sublayer 2 having a thickness of 45 nm and a $SiO_2$ sublayer 1 having a thickness of 90 nm (not described in FIG. 5). Each of the $Nb_2O_5$ sublayer 2 and the $SiO_2$ sublayer 1 was formed by reactive sputtering. Regarding main conditions for the deposition process of the $Nb_2O_5$ sublayer 2, Nb (metal) was used as a target, Ar gas containing 40 volume percent of $CO_2$ was used as an atmosphere gas, the target voltage was 580 V, and the electric power density was 3.9 W/cm$^2$. Regarding main conditions for the deposition process of the $SiO_2$ sublayer 1, Si (metal) was used as a target, Ar gas containing 25 volume percent of $CO_2$ was used as an atmosphere gas, the target voltage was 300 V, and the electric power density was 3.9 W/cm$^2$.

As described above, the anti-reflection film including an adhesive layer 4 composed of a $NbO_x$ layer, a $SiO_x$ layer, or a $SnO_x$ layer was prepared.

FIG. 6 is a graph showing the structure of the adhesive layer 4, deposition processes, and evaluation results of the adhesive force, according to the above embodiment. The adhesive force was evaluated by employing the above-described method using the anti-reflection films including an adhesive layer 4 composed of a $SiO_x$ layer, a $SnO_x$ layer, or a $NbO_x$ layer. FIG. 6 shows the evaluation results of the adhesive forces.

Numbers (1) to (9) shown in FIG. 6 correspond to columns (1) to (9) shown in FIG. 5. FIG. 6 shows that the adhesive force (represented by a workload F (nm·μN)) between the adhesive layer 4 and the substrate 5 varies depending on the reactive gas used in the deposition process of the $SnO_2$ sublayer 3, and the target and the reactive gas used in the deposition process of the adhesive layer 4. The results shown in (1) to (9) in FIG. 6 show adhesive forces measured using the same maximum load.

The dotted line shown in FIG. 6 shows a level of the adhesive force in the case where the $SnO_2$ sublayer 3 and the adhesive layer ($SiO_x$ layer) 4 were formed using $O_2$ as a reactive gas (shown in (3) in FIG. 6). This level corresponds to a level of the related art in which the adhesive layer is composed of a $SiO_x$ layer (1<x<2).

Referring to the results shown in FIG. 6, when the adhesive layer 4 was composed of a $SiO_x$ layer (1<x<2) or a $NbO_x$ layer (0<x<2.5), in the case where the $SnO_2$ sublayer 3 was formed using $CO_2$ as a reactive gas, the adhesive force was higher than that in the case where the $SnO_2$ sublayer 3 was formed using $O_2$ as a reactive gas.

When the adhesive layer 4 was composed of a $SiO_x$ layer (1<x<2), in the case where the adhesive layer 4 was formed using $O_2$ or $CO_2$ as a reactive gas and the $SnO_2$ sublayer 3 is formed using $CO_2$ as a reactive gas, higher adhesive forces could be obtained.

When the adhesive layer 4 was composed of a $SnO_x$ layer (1<x<2), in the case where the adhesive layer 4 was formed using $O_2$ as a reactive gas and the $SnO_2$ sublayer 3 is formed using $CO_2$ as a reactive gas, a higher adhesive force could be obtained.

Comparing the results shown in (1) to (3) and the results shown in (4) to (6) in FIG. 6, there was no significant difference between the adhesive forces when the adhesive layer 4 was composed of a $SnO_x$ layer (1<x<2) and the adhesive forces when the adhesive layer 4 was composed of a $SiO_x$ layer (1<x<2).

When a $NbO_x$ layer (0<x<2.5) was formed as the adhesive layer 4 using $CO_2$ as a reactive gas and the $SnO_2$ sublayer 3 was formed using $CO_2$ as a reactive gas, the highest adhesive force was obtained. When a $NbO_x$ layer (0<x<2.5) was formed as the adhesive layer 4 using Ar gas rather than using a reactive gas and the $SnO_2$ sublayer 3 was formed using $CO_2$ as a reactive gas, the second-highest adhesive force was obtained.

Referring to the results shown in (1), (4), and (7) in FIG. 6, when the adhesive layer 4 was formed using Ar gas, rather than using a reactive gas, in the case where the $SnO_2$ sublayer 3 was formed using $CO_2$ as a reactive gas, the adhesive force was higher than that in the case where the $SnO_2$ sublayer 3 was formed using $O_2$ as a reactive gas. It is believed that this is an effect of impurities (such as $H_2O$, $O_2$, or $CO_2$) remaining in a sputtering system.

According to the results described above, it became clear that when a $NbO_x$ layer (0<x<2.5) was formed as the adhesive layer 4 using $CO_2$ as a reactive gas and the $SnO_2$ sublayer 3 was formed on the adhesive layer 4 using $CO_2$ as a reactive gas, a higher adhesive force between the adhesive layer 4 and the substrate 5 could be achieved.

<Storing Test of Anti-reflection Films>

FIGS. 7A and 7B are tables showing the results of a storing test of anti-reflection films, according to an embodiment.

First, the layer structures of anti-reflection films used in the test and the conditions for the film deposition will be described. The layer structures of the anti-reflection films are as follows:

$SiO_2$ sublayer 1/$Nb_2O_5$ sublayer 2/$SnO_2$ sublayer 3/adhesive layer 4: $NbO_x$/substrate 5

$SiO_2$ sublayer 1/$Nb_2O_5$ sublayer 2/$SnO_2$ sublayer 3/adhesive layer 4: $SiO_x$/substrate 5

$SiO_2$ sublayer 1/$Nb_2O_5$ sublayer 2/$SnO_2$ sublayer 3/adhesive layer 4: not formed/substrate 5

The thicknesses of each of the sublayers and the like of the anti-reflection films are as follows:

Substrate (PET) 5: 125 μm
$NbO_x$: 5 nm
$SiO_x$: 5 nm
$SnO_2$ sublayer 3: 50, 70, 100, 120, or 150 nm
$Nb_2O_5$ sublayer 2: 45 nm
$SiO_2$ sublayer 1: 90 nm Each of the layers and the sublayers constituting the anti-reflection films were deposited by reactive sputtering. Main conditions for the deposition were as follows.

$NbO_x$: Niobium (metal) was used as a target, Ar gas containing 10 volume percent of $CO_2$ was used as an atmosphere gas, the target voltage was 330 V, and the electric power density was 0.39 $W/cm^2$.

$SiO_x$: Silicon (metal) was used as a target, Ar gas containing 15 volume percent of $CO_2$ was used as an atmosphere gas, the target voltage was 315 V, and the electric power density was 0.39 $W/cm^2$.

$SnO_2$ sublayer 3: Tin (metal) was used as a target, Ar gas containing 80 volume percent of $CO_2$ was used as an atmosphere gas, the target voltage was 450 V, and the electric power density was 3.9 $W/cm^2$.

$Nb_2O_5$ sublayer 2: Niobium (metal) was used as a target, Ar gas containing 20 volume percent of $CO_2$ was used as an atmosphere gas, the target voltage was 580 V, and the electric power density was 3.9 $W/cm^2$.

$SiO_2$ sublayer 1: Silicon (metal) was used as a target, Ar gas containing 25 volume percent of $CO_2$ was used as an atmosphere gas, the target voltage was 300 V, and the electric power density was 3.9 $W/cm^2$.

The outline of the test method and the results of the test will now be described.

FIG. 7A shows the states of the anti-reflection films after the anti-reflection films were stored in a thermostatic chamber maintained at 90° C. for 100 hours. FIG. 7B shows the states of the anti-reflection films after the anti-reflection films were boiled in pure water for five minutes. In FIGS. 7A and 7B, when there were no problems with the appearance of an anti-reflection film, the test result is represented by "A". When cracks were observed at edges (the periphery) of an anti-reflection film, the test result is represented by "B". When cracks were observed not only at edges (the periphery) but also in the central part of an anti-reflection film, the test result is represented by "C".

Referring to the test results shown in FIG. 7A, when the thickness of the $SnO_2$ sublayer 3 was 120 nm or less, there were no problems with the appearances of the anti-reflection film including an adhesive layer composed of $NbO_x$, the anti-reflection film including an adhesive layer composed of $SiO_x$, and the anti-reflection film not including an adhesive layer. Referring to the test results shown in FIG. 7B, when the thickness of the $SnO_2$ sublayer 3 exceeded 50 nm, problems occurred in the anti-reflection film including an adhesive layer composed of $NbO_x$, the anti-reflection film including an adhesive layer composed of $SiO_x$, and the anti-reflection film not including an adhesive layer. When the thickness of the $SnO_2$ sublayer 3 was 50 nm, a problem occurred in the anti-reflection film not including an adhesive layer, but there were no problems with the appearances of the anti-reflection film including an adhesive layer composed of $NbO_x$ and the anti-reflection film including an adhesive layer composed of $SiO_x$.

According to the above results, it is believed that when the thickness of the $SnO_2$ sublayer 3, which is the bottom layer of the anti-reflection layer 6, is 50 nm or less, there are no problems with the appearance of an anti-reflection film including an adhesive layer composed of $NbO_x$ or $SiO_x$ in the above-described two types of tests. However, when the adhesive layer is composed of a $NbO_x$ layer, by forming the $NbO_x$ layer by reactive sputtering using $CO_2$ as a reactive gas, as shown in FIG. 6, the adhesive force can be higher than that in the case where the adhesive layer is composed of a $SiO_x$ layer. Accordingly, it is evident that a $NbO_x$ layer can be used as an adhesive layer having a performance superior to that of a $SiO_x$ layer.

As described above, in an anti-reflection film in which an anti-reflection layer including a $SnO_2$ sublayer 3 as the bottom layer is formed on a PET film, with an adhesive layer 4 therebetween, as shown in FIG. 7B, in an anti-reflection film in the related art including an adhesive layer composed of a $SiO_x$ layer, when the thickness of the $SnO_2$ sublayer 3 increases, cracks are formed after a storing test. In contrast, when a $NbO_x$ layer is formed as the adhesive layer 4 by reactive sputtering using $CO_2$ as a reactive gas, a high adhesive force can be achieved and the formation of cracks of the anti-reflection film can be prevented.

Embodiments of the present application have been described. However, the present application is not limited to the above-described embodiments and various modifications can be made on the basis of the technical scope of the present application. For example, the number of sublayers constituting the anti-reflection layer, and the materials and the thicknesses of the sublayers can be appropriately determined according to need so as to match the application of the anti-reflection film and to satisfy the performance of the anti-reflection film.

For example, instead of the $SiO_2$ sublayer 1 used as a low-refractive-index sublayer, $MgF_2$ (n=1.38 to 1.4), $AlF_3$ (n=1.38), $CaF_2$ (n=1.23 to 1.63) or the like can also be used. Instead of the $Nb_2O_5$ sublayer 2 used as a high-refractive-index sublayer, $TiO_2$ (n=2.33 to 2.55), $ZrO_2$ (n=2.05), ZnO (n=2.1), $Ta_2O_5$ (n=2.16), ITO (n=2.0), $CeO_2$ (n=2.2), $Y_2O_3$ (n=1.87), $La_2O_3$ (n=1.95), $HfO_2$ (n=1.95), $MoO_2$ (n=about 2.0), $WO_3$ (n=1.85 to 2.1) or the like can also be used. Furthermore, instead of the $SnO_2$ sublayer 3 used as a medium-refractive-index sublayer, $Al_2O_3$ (n=1.63), $Sb_2O_5$ (n=1.71), MgO (n=1.74), $CeF_3$ (n=1.63), $NdF_3$ (n=1.61) or the like can also be used.

Furthermore, instead of PET, a film, a sheet, or a substrate made of another plastic such as triacetyl cellulose (TAC), polyethylene naphthalate (PEN), polymethylmethacrylate (PMMA), polycarbonate (PC), a polyester, a polyamide (PA), polyethersulfone (PES), polyvinyl chloride (PVC), polypropylene (PP), polyethylene (PE), or the like can also be used as the substrate (support) 5.

The anti-reflection layer may be composed of two or more thin-film sublayers. The anti-reflection film may have a structure in which a hard coat layer composed of an organic substance layer is provided on a substrate, an adhesive layer is provided on the hard coat layer, and an anti-reflection layer composed of two or more sublayers is provided on the adhesive layer. The hard coal layer can be formed using at least one material selected from reactive curable resins, thermosetting resins, and radiation-curable resins as a transparent material which has a hardness higher than a predetermined value and in which cracks are not easily formed. For example, the hard coat layer can be formed using a silicone resin, an epoxy resin, or the like.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. An optical element comprising:
   an optical film including a bottom sublayer;
   a substrate; and
   an adhesive layer disposed between the optical film and the substrate,
   wherein the adhesive layer is made of $NbO_X$, where $0<x<2.5$, wherein the adhesive layer is in contact with the bottom sublayer and the substrate, and wherein the bottom sublayer is composed of a $SnO_2$ sublayer.

2. The optical element according to claim 1,
   wherein surfaces of the adhesive layer are in contact with the optical film and the substrate, and
   the substrate and the optical film are integrated with each other, with the adhesive layer therebetween.

3. The optical element according to claim 1,
   wherein the optical film is an anti-reflection layer in which a plurality of sublayers having different refractive indices are stacked,
   the substrate and the bottom sublayer are integrated with each other, with the adhesive layer therebetween.

4. The optical element according to claim 1,
   wherein a high-refractive-index sublayer having a refractive index higher than that of the bottom sublayer is provided on the bottom sublayer, and
   a low-refractive-index sublayer having a refractive index lower than that of the bottom sublayer is provided on the high-refractive-index sublayer.

5. The optical element according to claim 4,
   wherein the low-refractive-index sublayer is selected from the group consisting of a $SiO_2$ sublayer, a $MgF_2$ sublayer, an $AlF_3$ sublayer, and a $CaF_2$ sublayer, and
   the high-refractive-index sublayer is selected from the group consisting of a $Nb_2O_5$ sublayer, a $TiO_2$ sublayer, a $ZrO_2$ sublayer, a ZnO sublayer, a $Ta_2O_5$ sublayer, a $CeO_2$ sublayer, an $Y_2O_3$ sublayer, a $La_2O_3$ sublayer, a $HfO_2$ sublayer, a $MoO_2$ sublayer, and a $WO_3$ sublayer.

6. An optical device comprising:
   an optical element, the optical element including:
   an optical film including a bottom sublayer;
   a substrate; and
   an adhesive layer disposed between the optical film and the substrate,
   wherein the adhesive layer is made of $NbO_X$, where $0<x<2.5$, wherein the adhesive layer is in contact with the bottom sublayer and the substrate, and wherein the bottom sublayer is composed of a $SnO_2$ sublayer.

* * * * *